(12) United States Patent
Sweeney et al.

(10) Patent No.: US 6,235,434 B1
(45) Date of Patent: May 22, 2001

(54) METHOD FOR MASK REPAIR USING DEFECT COMPENSATION

(75) Inventors: Donald W. Sweeney, San Ramon; Avijit K. Ray-Chaudhuri, Livermore, both of CA (US)

(73) Assignee: EUV LLC, Santa Clara, CA (US)

( * ) Notice: Subject to any disclaimer, the term of this patent is extended or adjusted under 35 U.S.C. 154(b) by 0 days.

(21) Appl. No.: 09/208,622

(22) Filed: Dec. 8, 1998

(51) Int. Cl.⁷ .................................................. G03F 9/00
(52) U.S. Cl. ........................................................ 430/5
(58) Field of Search .............................. 430/5, 322, 394; 378/35; 382/144

(56) References Cited

U.S. PATENT DOCUMENTS 5,356,662  10/1994  Early et al. .
5,698,346  12/1997  Sugawara et al. .
5,935,737  *  8/1999  Yan ............................................ 430/5

OTHER PUBLICATIONS

Hawryluk, A.M.; Stewart, D.;"Repair of Opaque Defects on Reflection Masks for Soft Soft X–Ray Projection Lithograpy" Journal of Vacuum Science and Technology, vol. 10, No. 6; Nov. 1, 1992; pp. 3182–3185.

* cited by examiner

Primary Examiner—S. Rosasco
(74) Attorney, Agent, or Firm—D. A. Nissen

(57) ABSTRACT

A method for repair of amplitude and/or phase defects in lithographic masks. The method involves modifying or altering a portion of the absorber pattern on the surface of the mask blank proximate to the mask defect to compensate for the local disturbance (amplitude or phase) of the optical field due to the defect.

4 Claims, 3 Drawing Sheets

Defect repair

Aerial image simulation

80nm phase defect @ 4x

Aerial image simulation

METHOD FOR MASK REPAIR USING DEFECT COMPENSATION

STATEMENT OF GOVERNMENT INTEREST

This invention was made with Government support under contract No. DE - AC04-94AL85000 awarded by the U.S. Department of Energy to Sandia Corporation. The Government has certain rights in the invention.

CROSS-REFERENCE TO RELATED APPLICATIONS

Not applicable.

BACKGROUND OF THE INVENTION

The present invention pertains generally to a method for repairing mask defects and in particular to a method for repairing amplitude and/or phase defects on mask blanks by optical compensation.

Photolithography is a well known technique for applying patterns to the surface of a workpiece, such as a circuit pattern to a semiconductor chip or wafer. This technique has additional advantage in being able to faithfully reproduce small and intricate patterns. Traditional photolithography involves applying electromagnetic radiation to a mask having openings formed therein (transmission mask) such that the light or radiation that passes through the openings is applied to a region on the surface of the workpiece that is coated with a radiation-sensitive substance, e.g., a photoresist. The mask pattern is reproduced on the surface of the workpiece by removing the exposed or unexposed photoresist.

However, the capabilities of conventional photolithographic techniques have been severely challenged by the need for circuitry of increasing density and higher resolution features. The demand for smaller feature sizes has not only driven the wavelength of radiation needed to produce the desired pattern to ever shorter wavelengths but has also lead to improvements in transmission (amplitude-only) masks that often involve phase shifting techniques in which certain of the openings, or portions of openings, are phase shifted with respect to adjacent openings.

The trend toward shorter wavelengths has also required the development of a different type of mask because of the fact that extreme ultraviolet radiation (EUV), i.e., radiation in the spectral region between 10 and 15 nm, is strongly absorbed generally by condensed matter. Thus, efficient transmission of EUV radiation requires the use of reflective optics. Consequently, a mask useful for photolithography employing EUV has a unique architecture, shown in FIG. 1, consisting of a reflective multilayer coating deposited onto a highly polished defect-free substrate. A patterned absorber layer is disposed on the surface of the reflective multilayer coating. The multilayer, required to make the substrate reflective at EUV wavelengths) is composed of alternating layers of EUV-reflective material; a typical multilayer coating, or stack, can be a 40-layer pair of metallic Mo and Si with a periodicity of about 7 nm. The mask substrate having a multilayer stack disposed thereon is commonly referred to as the mask blank. Phase-shifting methods can be employed by changing the material of the absorber from a purely opaque type to a partially transmitting material that induces a phase shift. Germanium is an example of a phase-shifting absorber material that can be used for EUV lithography.

For all lithographic technologies there are certain classes of defects that are difficult if not impossible to repair directly. In the case of conventional lithographic technologies employing transmission phase shift masks, repair not only requires making clear areas totally opaque but also opaque areas totally clear and, in addition, repairing phase defects. A phase defect is a defect wherein the mask transmits radiation where it should but of the wrong phase. The intensity as well as the phase of the repaired area must be within an acceptable tolerance to preserve the desirable imaging performance of a perfect mask. Because of the importance of phase shifting masks, considerable effort has been spent in trying to overcome problems of defect repair. As set forth in U.S. Pat. No. 5,795,685 entitled "Simple Repair Method for Phase Shifting Masks" issued to Liebman et al. on Aug. 18, 1998, one solution to the problem of repairing damaged phase shift masks involves identifying and mapping the defective region of a first phase shift mask, making it opaque, then making a phase shift repair mask that operatively cooperates with the first mask as well as functioning as a "trim" mask. While the approach in the '685 patent does not offer a solution to the difficult problem of repairing phase shift masks, it requires making a second mask which can be expensive and time consuming.

While defects in the absorber layer of a reflective mask can be repaired by art-recognized methods, such as a focused ion beam, flaws or defects in reflective mask blanks that alter the magnitude or phase of reflected EUV optical fields and that print in the lithographic process are, at present, impossible to correct. Defects are considered printable if their presence affects the process window of nearby features by more than 10%. The reason these defects cannot be corrected can be readily seen by referring to FIG. 1. A defect disposed on a Si or glass substrate surface or within the multilayer stack will be replicated throughout the multilayer reflector. Because the entire multilayer region acts to reflect EUV radiation, the only way to eliminate the effect of these defects is to remove and redeposit the entire multilayer in the vicinity of the defect, an impossible task. Additional sources of defects can include substrate imperfections such as dislocations and stacking faults that are replicated or partially replicated in the multilayer coating process.

What is needed is a simple method for repair of phase shift masks as well as a method of repairing printable defects in reflective masks that are presently impossible to repair.

SUMMARY OF THE INVENTION

By providing a method for compensating for defects on mask blanks that affect the amplitude and/or phase of the optical field the present invention now makes possible the use of mask blanks that heretofore were considered to be generally unrepairable. By modifying or altering a portion of the absorber pattern on the surface of the mask blank proximate to the mask blank defect it has been shown that it is possible to compensate for the local disturbance (amplitude or phase) of the optical field due to the defect. Alteration or modification of the proximate absorber material (preferably by removing a portion of the absorber material on the patterned mask to expose the underlying reflective surface) can be by any method known to those skilled in the art, by way of example, the use of a focused ion beam. The extent of alteration of the absorber material is sufficient to optically balance the mask blank defect and is generally not shape dependent.

It is therefore an advantage of the present invention to provide a low cost method of repairing mask blanks having phase and/or amplitude defects that cannot be directly repaired or are generally considered to be unrepairable.

It is a further advantage of the present invention to provide a defect-free circuit design on a semiconductor wafer.

DETAILED DESCRIPTION OF THE INVENTION

In accordance with the present invention it has been discovered that in the manufacture of semiconductor devices that reflective masks are advantageously employed but suffer serious problems with regard to the presence and repair of defects that affect the amplitude and/or phase of the optical field. The method of the present invention by optically compensating for mask defects provides for repair of patterned mask blanks, and particularly patterned reflective mask blanks, that cannot be directly repaired or are generally considered to be unrepairable. While the present repair method contemplates application to correct amplitude and/or phase defects by compensation on mask blanks or substrates generally, wherein the mask blank or substrate defect cannot be repaired directly or at all, its use will be illustrated by application to a reflective mask blank.

Figure 1:
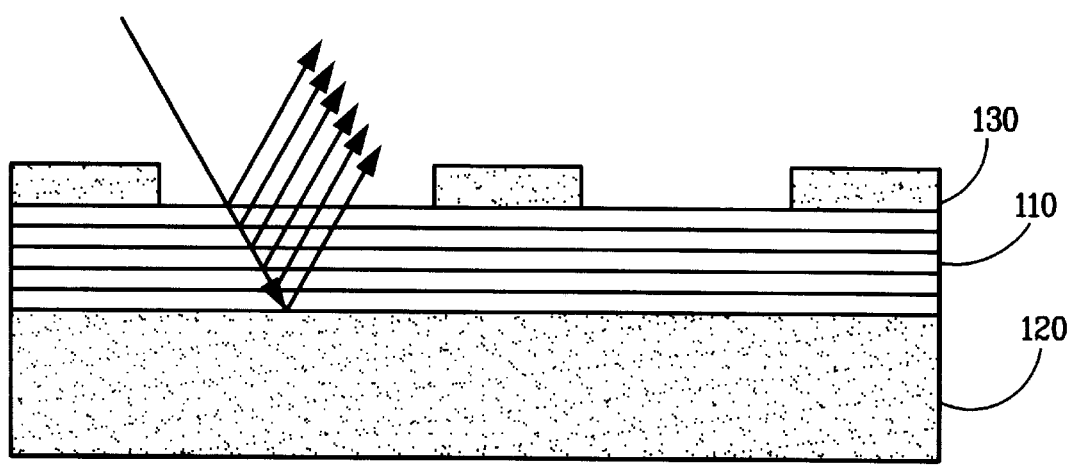
FIG. 1, shows the structure of a typical reflective mask.

Extreme Ultraviolet Lithography (EUVL) uses reflecting masks (FIG. 1) that are conventionally fabricated by depositing a reflective multilayer coating 110 onto a highly polished defect-free substrate 120 and patterning an absorber layer 130 disposed thereon. The multilayer, required to make the substrate reflective at EUV wavelengths is composed of alternating layers of material; a typical multilayer coating, or stack, is a 40-layer pair of metallic Mo and Si with a periodicity of about 7 nm. The mask substrate having a multilayer stack disposed thereon is commonly referred to as the mask blank. The mask blank is subsequently covered with a patterned absorbing film.

Anything that changes the reflectivity of the multilayer coating of the mask blank in terms of either amplitude and/or phase and affects any part of the pattern printed on the semiconductor wafer by more than about 10% is considered to be a defect. Defects can be introduced into the mask blank 1) by particle contamination or surface blemishes on the mask substrate, 2) during deposition of the multilayer stack, 3) surface contamination of the mask blank. No known method presently exists to repair defects caused by contamination of the substrate surface or produced during deposition of the multilayer stack. Consequently, the specification for EUVL mask fabrication requires the mask blank to be essentially defect-free (less than 0.01 defects/cm$^2$ at a defect size greater than 80 nm); a specification that is extremely difficult to meet and costly. By providing a method of compensating for these heretofore unrepairable defects the present invention enables the use of a mask blank that can contain printable defects.

Figure 2A:
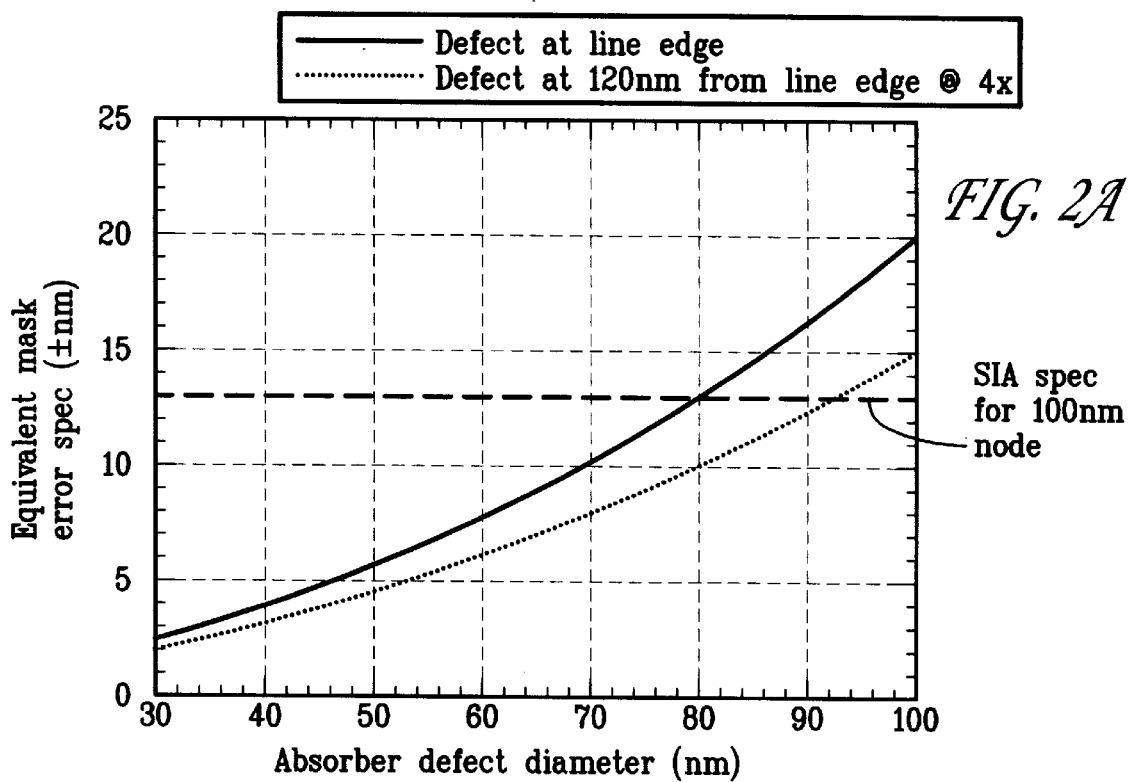
FIG. 2 illustrates the effect of position of a defect on printability.
Figure 2B:
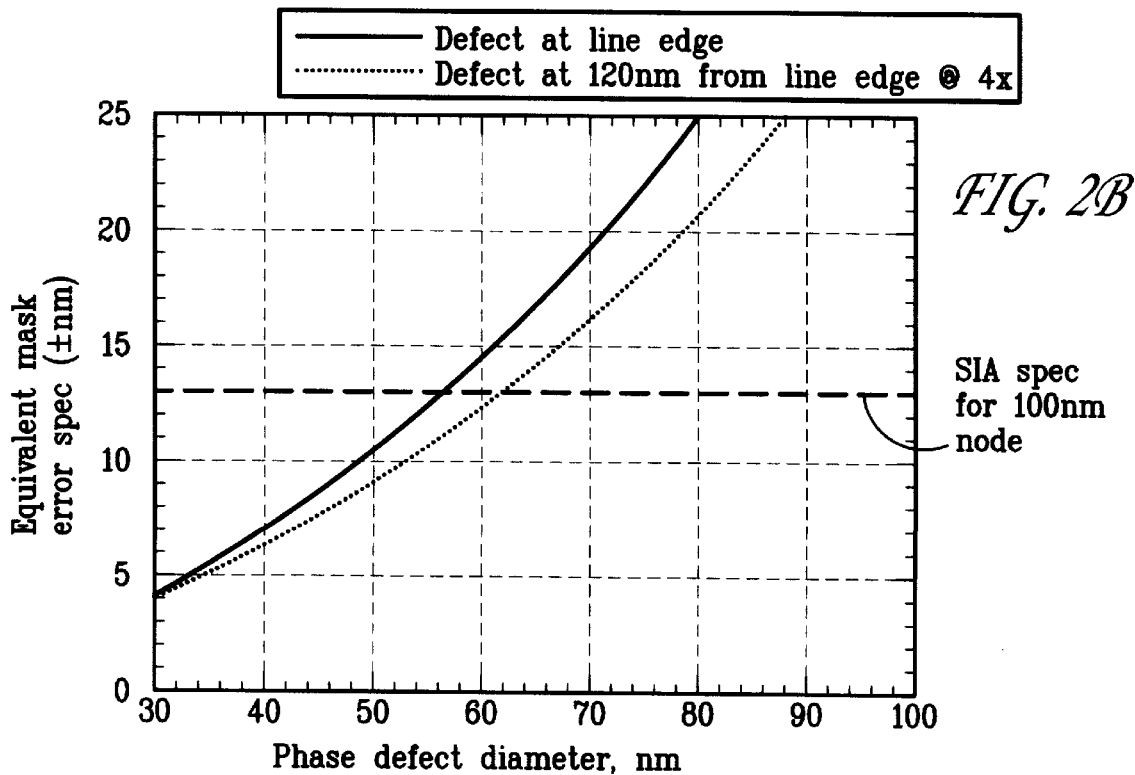

In the present invention the local disturbance in reflectance caused by an amplitude and/or phase defect is balanced by introducing an alteration or modification in the mask pattern (absorber film) proximate the mask defect. In this way the local disturbance (amplitude or phase) of the optical field of the EUV radiation due to the defect is compensated for. Alteration of the mask pattern needs to be large enough to balance the aberration caused by mask defect but not so large as to perturb the intended lithographic patterning beyond some defined tolerance. It should be noted at this point that it is the equivalent size of the mask defect that must be compensated not the geometric size. The equivalent size is determined by the perturbing effect of the mask defect on the optical field. It is not only the equivalent size of the mask defect that determines effect on the optical field but also, as illustrated in FIG. 2, the position of the defect in relation to the edge of a mask feature, such as a line. The curves of FIG. 2, which show the effect of position of a defect with respect to its proximity to an absorber line, are for 100 nm dense lines, a numerical aperture (NA)=0.1, and partial coherence (s)=0.7. FIG. 2a shows that an absorbing defect whose equivalent size is greater than about 80 nm positioned at a line edge will be printed, whereas an absorbing defect 120 nm from a line edge will not be printed until its equivalent size is greater than about 92 nm. The same relationship holds true for phase defects, except that because of their greater influence on the optical field these defects will be printed at smaller equivalent sizes, typically about 56 and 62 nm respectively (FIG. 2b). Thus, the present method is applicable to a size and/or type classification of defects where this compensation is achievable. By way of example, the position and equivalent size of defect-induced reflectance disturbances can be determined by a characterization technique such as lithographic printing. This information could be used for subsequent compensation of the absorber film proximate to a optical field distorting defect.

Figure 4A:
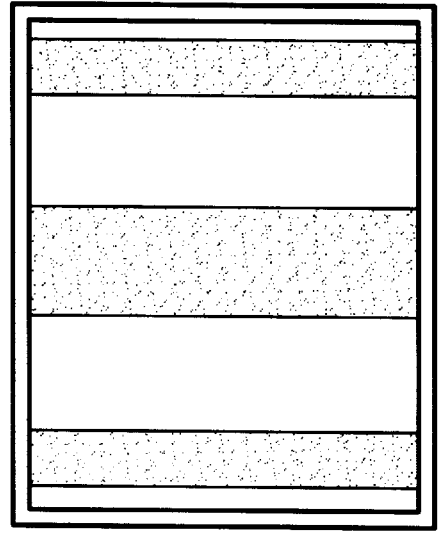
FIG. 4 illustrates the effect of compensation.
Figure 3A:
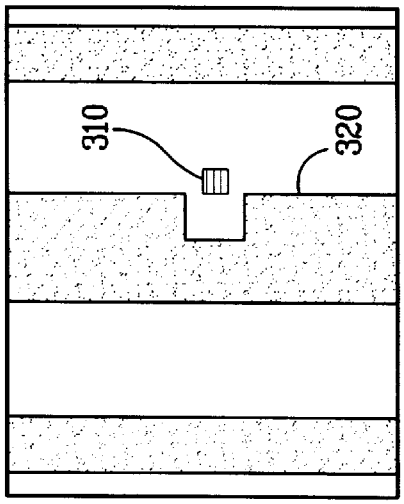
FIG. 3 shows the effect of a mask blank defect on the aerial image of an absorber line.

A concept of the present invention is illustrated by reference to FIGS. 3 and 4. Here, the method is modeled to show the effect of an 80 nm phase defect 310 at the boundary of a 400 nm absorber line 320 on a 4× reduction mask prior to compensation (FIG. 3) and after compensation (FIG. 4). The effects shown in FIGS. 3 and 4 have been modeled using a standard lithographic modeling code for a 0.1 numerical aperture system operating at a wavelength of 13.4 nm and a partial coherence of 0.7 (conventional illumination). It should be noted that the results produced by this modeling code are not dependent upon wavelength, numerical aperture or optical character of the defect being modeled.

Figure 4B:
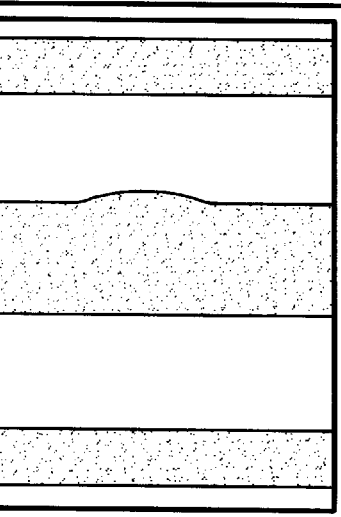
Figure 3B:
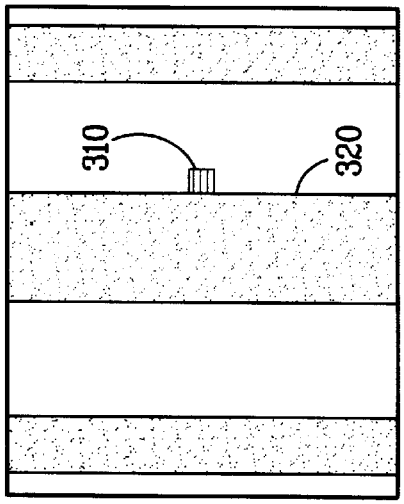

Referring now to FIG. 3b, it can be seen that an 80 nm defect has the effect of widening the absorber line by about 9 nm, which constitutes a critical lithographic defect. By removing a portion of the proximate absorber line material and exposing the underlying reflective mask blank (FIG. 4a) the defect can be compensated for by optical balancing and the linewidth defect is removed, as shown in the aerial image (FIG. 4b). Moreover, the amount of the absorber line material removed is not critically shape dependent. Modeling simulations done through the depth of focus showed that the inventive compensation method was still valid.

There are numerous ways of removing portions of absorber line material to expose the underlying reflective mask blank and thereby compensate for mask defects, that would be obvious to those skilled in the art. Among these are inspecting the mask for defects after patterning by an at wavelength inspection to understand the optical characterization of the defect in order to make appropriate correction. Then using a focused ion beam to remove sufficient material from the absorber line to expose the reflective mask blank and compensate for the defect. It will be appreciated that in this approach it is necessary that the mask repair process retain the reflective multilayer under the absorber region and that the exposed multilayer have sufficient reflectance for compensation to be achieved.

A second method for correcting mask defects can be to locate the magnitude and position of defects prior to mask patterning, e.g., by lithographic printing, and subsequently incorporate the appropriate defect compensation into the absorber pattern layout.

While the invention has now been described in terms of certain preferred embodiments, and exemplified with respect thereto, those skilled in the art will appreciate that various modifications, changes, substitutions, and omissions can be made without departing from the scope of the present invention which is limited only by the following claims.

We claim:

1. A method for repairing a reflective mask blank patterned with an absorbing material, comprising the steps of:

determining the equivalent size of a mask defect; and removing a portion of the absorber material proximate to the mask defect thereby optically compensating for the mask defect.

2. The method of claim 1, wherein the patterned mask blank is a multilayer coated reflective mask.

3. The method of claim 2, wherein said step of removing includes exposing the reflective surface of the mask blank underlying the absorber material.

4. A method for repairing a multilayer coated reflective mask, comprising the steps of:

locating the position of each defect on the surface of the reflective mask;

determining the magnitude of the reflectance disturbance associated therewith; and incorporating defect compensation into an absorber pattern disposed on the surface of the reflective mask.

* * * * *